United States Patent [19]

Takeda et al.

[11] 4,395,714

[45] Jul. 26, 1983

[54] ANTENNA ARRAY SYSTEM USABLE FOR AM/FM RECEIVER

[75] Inventors: Shigeki Takeda; Junichi Shibata; Masashi Shimakata; Yasuhiro Oshime, all of Tokorozawa; Shintaro Gomi; Katsuaki Kawamura, both of Kawagoe, all of Japan

[73] Assignee: Pioneer Electronic Corporation, Tokyo, Japan

[21] Appl. No.: 241,459

[22] Filed: Mar. 3, 1981

[30] Foreign Application Priority Data

Mar. 3, 1980 [JP] Japan ............................... 55-27315

[51] Int. Cl.³ .......................................... H01Q 21/00
[52] U.S. Cl. .................................. 343/725; 343/701
[58] Field of Search ............... 343/701, 725, 726, 728, 343/713, 727

[56] References Cited

U.S. PATENT DOCUMENTS

| 3,845,489 | 10/1974 | Sauer et al. | 343/713 |
| 4,001,696 | 1/1977 | Bannerman | 343/713 |
| 4,290,069 | 9/1981 | Duda | 343/727 |

*Primary Examiner*—David K. Moore
*Attorney, Agent, or Firm*—Michael J. Striker

[57] ABSTRACT

An antenna array system which comprises at least one balanced antenna having an electric neutral point and two output end terminals positioned closely to each other, at least one unbalanced antenna having one end thereof dc-coupled with the electric neutral point of the balance antenna and the other end thereof positioned closely to the end terminals of the balanced antenna, first means for picking up a first frequency wave signal such as FM wave signal from the balanced antenna, and second means for picking up a second frequency wave signal such as an AM wave signal from the unbalanced antenna.

14 Claims, 3 Drawing Figures

4,395,714

ANTENNA ARRAY SYSTEM USABLE FOR AM/FM RECEIVER

FIELD OF THE INVENTION

The present invention relates to an antenna system and, more particularly, to an antenna array system which is suitable for AM/FM receiver to be mounted on a moving vehicle such as an automobile.

BACKGROUND OF THE INVENTION

As is well known in the art, a loop antenna is often used for catching FM waves which are to be reproduced in an FM receiver mounted on a moving vehicle such as an automobile. When, however, an AM/FM receiver is to be mounted on the moving vehicle, another antenna than the loop antenna is to be provided for receiving AM waves which usually have lower frequencies of the KHz order than the FM waves of the MHz order. When, accordingly, an AM/FM receiver is installed in the moving vehicle, at least two different antenna systems respectively for AM and FM waves are to be mounted on a peripheral portion such as a roof of the moving vehicle. The two different antenna systems occupy a large or wide space around the moving vehicle thereby adversely affecting the aspect or design of the vehicle.

SUMMARY OF THE INVENTION

It is accordingly a primary object of the present invention to provide an improved antenna array system which is usable for catching both AM and FM waves while being compact in construction.

It is another object of the present invention to provided an antenna array system which is suitable for an AM/FM receiver installed in a moving motor vehicle.

It is a further object of the present invention to provide an antenna array system which can effectively pick up a low frequency wave signal and a high frequency wave signal separately from and independently from each other.

It is still a further object of the present invention to provide an antenna array system which can readily perform impedance matching control therein.

In accordance with the present invention, such objects as mentioned above are accomplished basically by an antenna array system which comprises at least one balanced or symmetric antenna having an electric neutral point and two output end terminals positioned closely to each other, at least one unbalanced or asymmetric antenna having one end terminal thereof electrically coupled with the electric neutral point of said balanced antenna and the other end terminal thereof positioned closely to the output end terminal of said balanced antenna, first means connected to the output end terminals of said balanced antenna, for picking up a first frequency wave signal caught by said balanced antenna, and second means connented to the other end terminal of said unbalanced antenna, for picking up a second frequency wave signal caught by said unbalanced antenna and being different in frequency from said first frequency wave signal.

BRIEF DESCRIPTION OF THE DRAWINGS

Other objects, features and advantages of the present invention will be more clearly understood from the following description taken in conjunction with the accompanying drawings, in which.

DETAILED DESCRIPTION OF THE EMBODIMENTS

Figure 1:
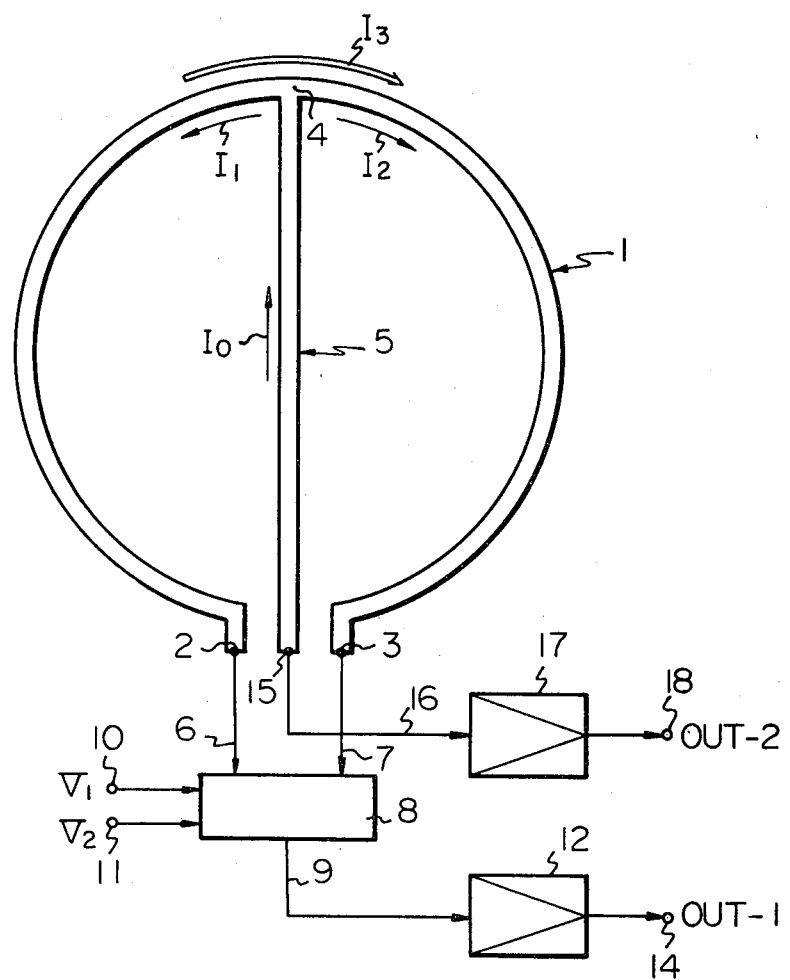
FIG. 1 is a block diagram showing an antenna array system according to the present invention.

Referring now to the drawings and especially to FIG. 1, an antenna array system according to the present invention comprises a balanced antenna 1 such as loop antenna which has two output end terminals 2 and 3 positioned closely to each other. The balanced antenna has an electric neutral point 4 to which one end terminal of a rod or pole antenna 5 is connected. The rod antenna 5 is an unbalanced antenna. The output end terminals 2 and 3 are respectively connected to input terminals 6 and 7 of an impedance matching circuit 8 which is adapted to produce an unbalanced output signal on its output terminal 9. The impedance matching circuit 8 has a balanced input impedance variable with a first control voltage $V_1$ applied to a first control terminal 10. The balanced input impedance should be controlled to perform the impedance match for a first frequency wave signal such as FM wave signal. An unbalanced output impedance of the impedance matching circuit 8 is variable with a second control voltage $V_2$ applied to a second control terminal 11 so as to perform the impedance match between the output unbalanced impedance of the impedance matching circuit 8 and an input unbalanced impedance of the next or succeeding stage. The output terminal 9 of the impedance matching circuit 8 is connected to an input terminal of a first unbalanced amplifire 12. The first frequency signal amplified by the amplifier 12 is applied to an output terminal 14 of the antenna array system. The other end terminal 15 of the rod antenna 5 is connected through a line 16 to a second unbalanced amplifier 17. The second unbalanced amplifier 17 amplifies and passes therethrough a second frequency wave signal such as an AM wave signal to another output terminal 18 of the antenna array system.

It is now assumed that a current $I_0$ is produced to flow in the rod antenna 5 due to a low frequency wave signal caught by the rod antenna 5. The current $I_0$ is divided into two currents $I_1$ and $I_2$ respectively flowing through the loop antenna 1 in opposite directions from the neutral point 4 to the output end terminal 2 and 3. Since the loop antenna 1 is balanced or symmetric with respect to the rod antenna and the impedance matching circuit 8 has the balanced input impedance, the currents $I_1$ and $I_2$ has the same magnitude as each other and therefore those currents $I_1$ and $I_2$ are cancelled together within the impedance matching circuit 8. The impedance matching circuit 8 therefore produces a high frequency wave signal on the output terminal 9 in response only to a current $I_3$ flowing in one direction through the antenna 1 which is generated by an electromagnetic wave caught by the antenna 1. On the other hand, the current $I_0$ is amplified by the amplifier 17 which then produces the second frequency wave signal on the output terminal 18.

When the second frequency wave signal is an AM wave signal that is an MW signal, the rod antenna 5 is too short to perform the impedance match with the MW signal. It will be, in practice, necessary to use an amplifier with a high input inductance but a small input capacitance as the amplifier 17 since the rod antenna 5 is capacitive against the MW wave signal.

Figure 2:
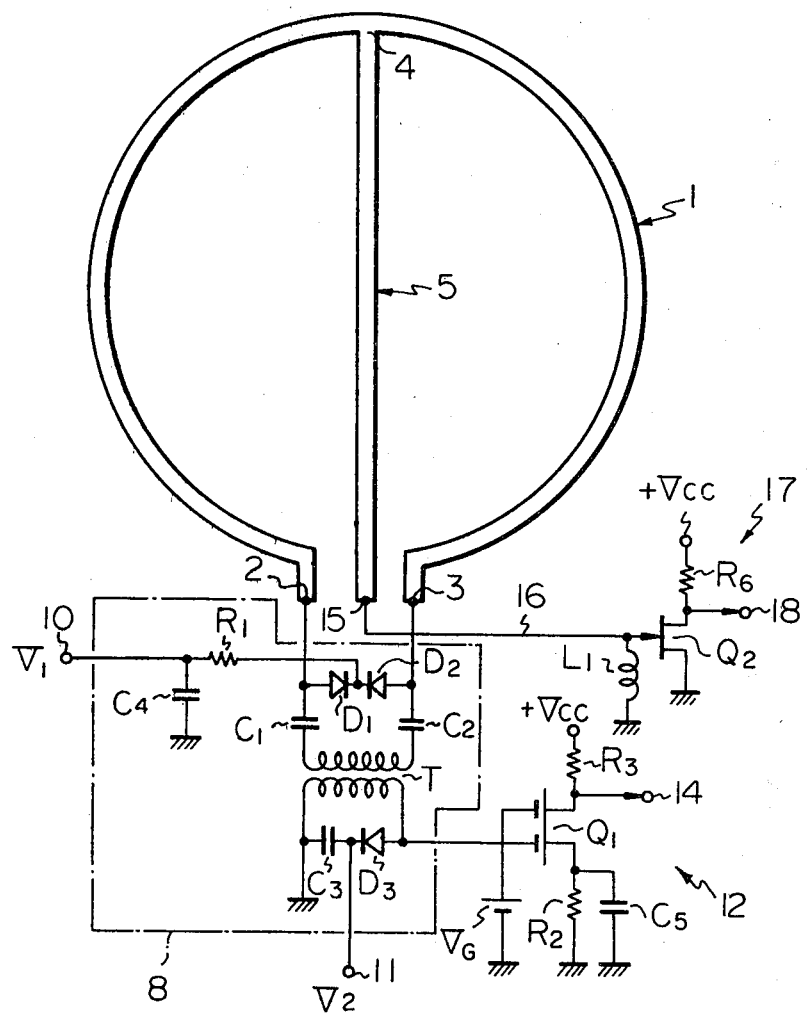
FIG. 2 is a circuit diagram showing a circuit arrangement of the antenna array system of FIG. 1.

In FIG. 2, there is shown a circuit arrangement of the impedance matching circuit 8 and amplifiers 12 and 17. The impedance matching circuit 8 includes an impedance matching transformer T having primary and secondary coils. End terminals of the primary coil are respectively connected through capacitors $C_1$ and $C_2$ to the output terminals 2 and 3 of the balanced antenna 1. A couple of varactor diodes $D_1$ and $D_2$ are respectively connected at their anodes to the output terminals 2 and 3 of the antenna 1 and connected at their cathodes with each other. The capacitors $C_1$ and $C_2$, and varactor diodes $D_1$ and $D_2$ constitute a balanced variable reactance circuit. The reactances of the varactor diodes $D_1$ and $D_2$ are controlled by the control voltage $V_1$ supplied through the control terminal 10 and a low pass filter constituted by a capacitor $C_4$ and a resistor $R_1$ to the cathodes of the varactor diodes $D_1$ and $D_2$. The anodes of the varactor diodes $D_1$ and $D_2$ and dc-coupled to the ground through the antenna 1 and an input impedance circuit of the amplifier 17. To the secondary coil of the transformer T is connected an unbalanced variable reactance circuit which is constituted by a varactor diode $D_3$ having its anode connected to one end of the secondary coil and a capacitor $C_3$ connected between the cathode of the caractor diode $D_3$ and the other end of the secondary coil. The other end of the secondary coil is grounded. The second control voltage is impressed through the second control terminal 11 onto the cathode of the varactor diode $D_3$ which has a reactance according to the control voltage $V_2$. The first unbalanced amplifier 12 includes a dual gate field effect MOS transistor $Q_1$ having its first gate connected to the one end of the secondary coil of the transformer T and its second gate is biased by a bias voltage source $V_G$. Ther cource of the transistor $Q_1$ is connected through a source resistor $R_2$ and a bypass capacitor $C_5$ to the ground. The drain of the transistor $Q_1$ is connected through a drain resistor $R_3$ to a voltage source +Vcc. The drain of the transistor $Q_1$ is connected to the output terminal 14. The second unbalanced amplifier 17 includes a junction field effect transistor $Q_2$ having its gate connected to the output end terminal 15 of the rod antenna 5 through the line 16. An inductance element $L_1$ by-passes the gate and source terminals of the field effect transistor $Q_2$. The source of the transistor $Q_2$ is grounded. The drain of the transistor $Q_2$ is connected through a drain resistor $R_6$ to the voltage source +Vcc and further connected to the output terminal 18. The inductance element $L_1$ acts to perform the impedance match with the rod antenna 5 and also to provide a dc-coupling between the end terminal of the rod antenna 5 and the ground so as to apply the ground potential through the antennas 1 and 5 to the anodes of the varactor diodes $D_1$ and $D_2$. It is to be understood that the control voltage $V_1$ is applied across the varactor diodes $D_1$ and $D_2$ by means of the rod antenna 5, the loop antenna 1 and the inductance element $L_1$. The inductance element $L_1$ may be substituted for a resistor of a high resistance, if preferred.

It is to be noted that the resistor $R_1$ should have a relatively large resistance and the capacitors $C_1$ and $C_2$ should have a relatively small capacitances so that the end terminal 2 and 3 of the loop antenna 1 are isolated from the ground with respect to medium wave signals.

Figure 3:
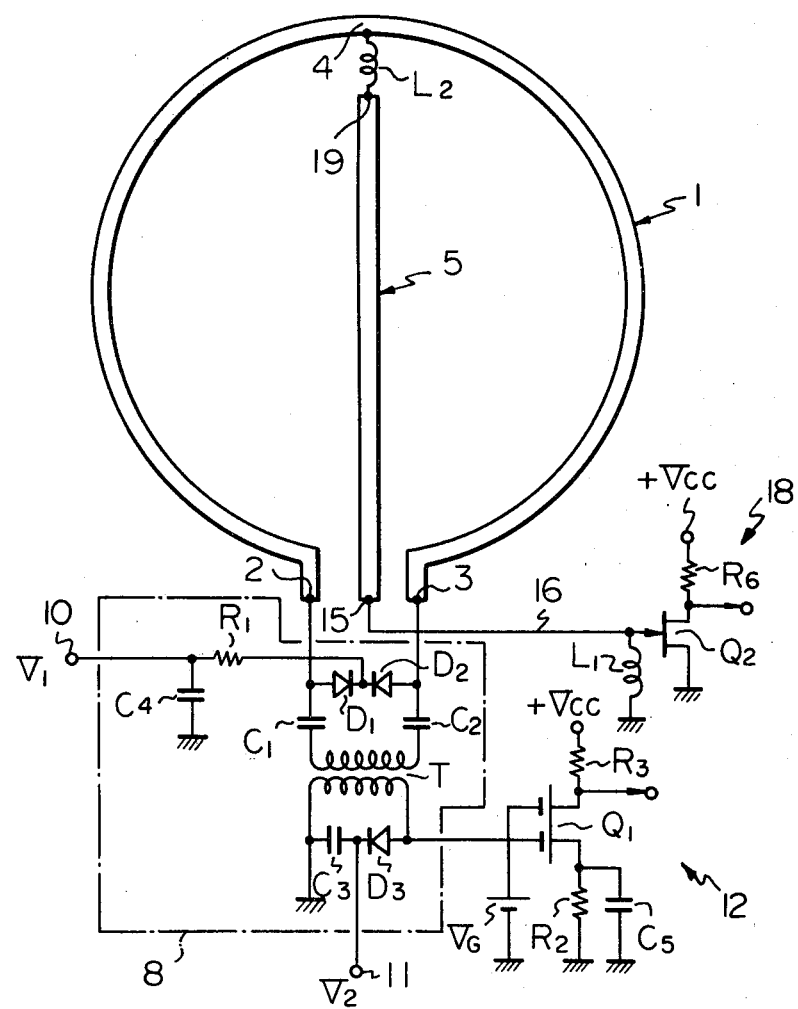
FIG. 3 is a circuit diagram showing another circuit arrangement of the antenna array system of FIG. 1.

In FIG. 3, there is shown another antenna array system according to the present invention which has the same construction as the system of FIG. 2 except that an induction element $L_2$ is inserted between the electric neutral point 4 and the end 19 of the rod antenna 5. Thus, the end 19 of the rod antenna 5 is dc-coupled with the neutral point 4 but isolated from the neutral point 4 with respect to high frequencies.

In this arrangement, the rod antenna can be isolated from or protected from high frequency noises caught by the loop antenna 1. When the antenna array system is used for a motor vehicle, the loop antenna 1 is subjected to high level of high frequency noises generated from ignition in the engine. It is now apparent that the antenna array system of FIG. 3 is especially suitable for an AM/FM receivers installed in the motor vehicle.

When it is desired an antenna array having a plurality of directivities with maximum sensitive directions different from each other, an additional loop antenna may be provided in such a manner that both loop antennas crossing each other at their electric neutral points and having their output terminal positioned closely to each other. Such antenna array mentioned above is useful for avoiding so-called multipass noises by selectively using the loop antennas.

As being apparent from the above description, the antenna array system according to the present invention contains two different types of antennas which are integral but electrically isolated from each other for two different frequency bands for example FM and AM frequency bands. Thus, the antenna array system of the invention is compact in construction even though it is useful for receiving two different frequency band wave signals.

It will be understood that the invention is not to be limited to the exact construction shown and described and that various changes and modifications may be made without departing from the spirit and the scope of the invention, as defined in the appended claims.

What is claimed is:

1. An antenna array system comprising at least one loop antenna having an electric neutral point and two output terminals positioned closely to each other, at least one rod antenna having one end terminal thereof electrically coupled with the electric neutral point of said loop antenna and the other end thereof positioned closely to the end terminals of said loop antenna, first means connected to the output end terminals of said loop antenna, for picking up a first frequency wave signal caught by said loop antenna, and second means connected to the other end of said rod antenna, for picking up a second frequency wave signal caught by said rod antenna and being different in frequency from said first frequency wave signal, said first means including balanced variable reactance circuit connected to the output terminals of said loop antenna and having a reactance variable with a first control dc voltage; and first voltage supply means for supplying said first control dc voltage via said rod antenna and said loop antenna to said variable reactance circuit.

2. An antenna array system as defined in claim 1, in which said balanced variable reactance circuit includes a pair of varactor diodes connected with each other at the cathodes thereof and having the anode thereof respectively connected to the two output terminals of said loop antenna.

3. An antenna array system as claimed in claim 1, in which said first voltage supply means includes a variable dc voltage source, and a low pass filter for passing therethrough said variable dc voltage to the cathodes of said varactor diodes.

4. An antenna array system as defined in claim 1, further comprising:
(a) a transformer having a primary coil the end terminals of which are connected to the output terminals of said loop antenna through a pair of capacitors, respectively; and
(b) an unbalanced variable reactance circuit connected to a secondary coil of said transformer.

5. An antenna array system as claimed in claim 4, wherein said unbalanced variable reactance circuit includes:
(a) a series connection of a capacitor and a varactor diode, said series connection being connected between the two end terminals of said secondary coil; and
(b) a second control dc voltage supply means for supplying a second control dc voltage across a connecting point between said capacitor and said varactor diode and a point of reference potential.

6. An antenna array system as defined in claim 4, further comprising a first amplifier for amplifying said first frequency wave signal from said unbalanced variable reactance circuit.

7. An antenna array system as defined in claim 1, said first means including a second amplifier connected to said the other terminal of said rod antenna for passing therethrough said second frequency wave signal only; and dc bypass means connected to the other end terminal of said rod antenna, for passing therethrough dc component only but allowing said second frequency wave signal to reach said second amplifier.

8. An antenna array system as defined in claim 7, in which said second amplifier has a high input impedance for a dc component.

9. An antenna array system as defined in claim 8, in which said second amplifier includes a field effect transistor having the gate terminal thereof connected to said the other end terminal of said rod antenna.

10. An antenna array system as defined in claim 7, in which said dc bypass means includes a high inductance element.

11. An antenna array system as defined in claim 10, in which said high inductance element is an inductance coil.

12. An antenna array system as defined in claim 10, in which said high inductance element is a resistor with a high resistance.

13. An antenna array system as defined in claim 1, in which said one end terminal of said rod antenna is directly connected to said electric neutral point of said loop antennas.

14. An antenna array system as defined in claim 1, in which said one end of said rod antenna is connected by way of an inductance element to said electric neutral point of said loop antennas.

* * * * *